US006445802B1

(12) United States Patent
Dan

(10) Patent No.: US 6,445,802 B1
(45) Date of Patent: Sep. 3, 2002

(54) SOUND VOLUME CONTROLLABLE COMMUNICATION APPARATUS

(75) Inventor: Kenichi Dan, Nagoya (JP)

(73) Assignee: Brother Kogyo Kabushiki Kaisha, Nagoya (JP)

( * ) Notice: Subject to any disclaimer, the term of this patent is extended or adjusted under 35 U.S.C. 154(b) by 0 days.

(21) Appl. No.: 09/084,225

(22) Filed: May 26, 1998

(30) Foreign Application Priority Data

May 26, 1997 (JP) ............................................ 9-135538

(51) Int. Cl.[7] ................................................ H03G 3/00
(52) U.S. Cl. ...................................... 381/104; 379/418
(58) Field of Search ................................ 381/104, 107, 381/109; 379/388.03, 388.06, 390.01, 390.03, 142.18, 418

(56) References Cited

U.S. PATENT DOCUMENTS 5,313,523 A * 5/1994 Kawauchi ................... 381/104
5,848,148 A * 12/1998 Yatsu .................... 379/390.01
5,966,438 A * 10/1999 Romesburg .................. 379/57
6,094,481 A * 7/2000 Deville et al. .............. 379/390
6,128,383 A * 10/2000 Takeyama ................... 381/104
6,173,056 B1 * 1/2001 Romesburg et al. ........ 381/104
6,233,462 B1 * 5/2001 Kanai .......................... 381/57

FOREIGN PATENT DOCUMENTS

JP 4-95437 3/1992
JP 7-312639 * 11/1995 ............ 379/390.01
JP 11-112614 * 4/1999 ............ 379/390.01

* cited by examiner

*Primary Examiner*—Xu Mei
(74) *Attorney, Agent, or Firm*—Oliff & Berridge, PLC

(57) ABSTRACT

A sound volume-controllable communication apparatus capable of outputting signals as monitoring sounds simultaneously with the transmission and reception of the signals is disclosed. At the time of transmission of a signal from, for example, a facsimile machine, a sound volume control unit performs control such that the volume of a sound output from a sound outputting unit is set to a volume lower than the volume normally set. More specifically, when a number key or an automatic dial key is operated, the facsimile machine stores into a memory the present volume of monitoring sounds from a speaker, and then sets the speaker volume to zero, thereby establishing a state where no sound will be produced from the speaker. If the key operated is a number key, the facsimile machine continually transmits a selection signal until the operation on the number key ends. The facsimile machine then sets the speaker volume back to the value stored in the memory, thereby establishing a state where sounds will be produced from the speaker. If the key operated is an automatic dial key, the facsimile machine reads, one digit at a time, the corresponding number from the memory, and sequentially transmits the corresponding selection signals. After all of the signals corresponding to the digits have been transmitted, the facsimile machine resumes the state where sounds will be produced from the speaker.

20 Claims, 4 Drawing Sheets

SOUND VOLUME CONTROLLABLE COMMUNICATION APPARATUS

BACKGROUND OF THE INVENTION

1. Field of Invention

The invention relates to a sound volume-controllable communication apparatus capable of outputting signals as monitoring sounds simultaneously with the transmission and reception of the signals.

2. Description of Related Art

Conventional telephone sets equipped with an on-hook dial function are designed so that at the time of on-hook dialing, various signals transmitted to and received from an exchange to establish a connection to an external apparatus can be outputted as sounds from a speaker provided separately from a handset.

Such a telephone set enables a user to hear various signal tones transmitted to and received from an exchange, without picking up the handset, since during the on-hook dial mode, the telephone set outputs, as sounds from a separate speaker, various signals received from the exchange (for example, a dial tone for notifying that the system is ready for dialing, a ring-back tone for notifying that the designated external apparatus is being called, a busy tone for notifying that the designated external apparatus is busy, and the like) or various signals transmitted to the exchange (for example, selection signals, such as the DP signal or the DTMF signal, that are transmitted in accordance with dialing operation).

Among the various signals outputted as monitoring sounds by the telephone set during the on-hook dial mode, the signals received from an exchange should be output at such a sound volume that a user can distinguish different signal tones, because these signals indicate whether the system is ready for dialing, or whether a designated external apparatus is being called or is busy.

On the other hand, the selection signals tones transmitted from the telephone set to the exchange usually do not need to be heard or distinguished on the side of the telephone set. The outputting of the selection signal tones at a high volume can be offensive to the ear. Although the conventional telephone sets with the on-hook dial function normally allow a user to adjust the monitoring sound volume so as to reduce the volume of selection signal tones, the adjustment also reduces the volume of the ring-back tone, the busy tone and the like, thereby making it difficult to distinguish those signal tones.

As a device for adjusting the volume of monitoring sounds in a telephone set of this type, Japanese patent application laid-open No. Hei 4-95437 describes an on-hook dial monitor that maintains a low monitoring sound volume up to a predetermined number of digits being dialed and then increases the monitoring sound volume.

Although this technology achieves a lower volume for the dial tone than the volume for the ring-back tone and the like, the technology cannot appropriately reduce the volume of the selection signal tones. More specifically, the aforementioned on-hook dial monitor merely maintains a reduced monitoring sound volume up to a pre-stored number of dialing digits. Therefore, if the number of digits of a telephone number, or the like, being actually dialed is greater than the predetermined number of dialing digits, the monitoring sound volume is increased before the dialing of the number is completed, so that ear-offensive or rough sounds caused by the transmission of selection signals are produced.

In addition to the ear-offensive sounds, the production of selection signal tones as monitoring sounds after an intermediate stage of the dialing operation, may give a user unnecessary uncertainty as to whether the digits dialed without being accompanied by monitoring sounds, were properly transmitted. These problems may be eliminated by setting the aforementioned number of dialing digits to a greatest number of digits conceivable as a telephone number or the like. With this countermeasure, however, if the number of digits actually dialed is less than the predetermined number of dialing digits, the monitoring sound volume remains low for some time after the dialing is completed, resulting in another problem that the volume is too low to clearly hear the ring-back tone and the like. Therefore, the employment of the aforementioned on-hook dial monitor still finds it difficult to appropriately control the volume of selection signal tones.

Although the problems of the conventional art have been stated in conjunction with a telephone set with the on-hook dial function, these problems can also occur in substantially the same manner in various other communication apparatuses with a similar on-hook dial function, for example, facsimiles or various data communication apparatuses with such a function.

As is well known, the DTMF signal transmitted from a telephone set is used not only for establishing a connection to an external communication apparatus, but also for transmitting data to an external communication apparatus as in the case of transmission of a message to a radio pager. Such data transmission may also suffer from the aforementioned problems, provided that the DTMF signal is outputted as a monitoring sound.

SUMMARY OF THE INVENTION

Accordingly, it is an object of the invention to provide a sound volume-controllable communication apparatus capable of outputting monitoring sounds while transmitting and receiving signals and capable of eliminating ear-offensive sounds, particularly when transmitting a selection signal.

According to the invention, there is provided a sound volume-controllable communication apparatus including a sound outputting unit capable of outputting a signal as a monitoring sound simultaneously with the transmission and reception of the signal, and a signal transmitting unit that transmits a signal corresponding to a number designated. At the time of transmission of the signal by the signal transmitting unit, a sound volume control unit performs control such that the volume of a sound output from the sound outputting unit is set to a volume lower than the volume normally set.

In the sound volume-controllable communication apparatus, when the signal transmitting unit transmits a signal corresponding to a number designated, the sound volume control unit performs a volume reduction control such that the sound output by the sound outputting unit is reduced to a volume lower than a normal volume. Therefore, although the signal being transmitted by the signal transmitting unit may also be output as a monitoring sound, the volume of the monitoring sound is lower than the normal volume. Consequently, the sound volume-controllable communication apparatus of the invention prevents the production of an ear offensive monitoring sound at the time of transmission of a signal even if monitoring sound signals are output during the transmission and reception of the signals. The communication apparatus also eliminates the problem that monitoring sounds are too low to hear at the time of the reception of signals.

The signal transmitting unit may transmit a signal corresponding to a number key simultaneously with operation of the number key, or may also transmit a signal corresponding to a number pre-stored in a memory.

If the signal transmitting unit transmits a signal simultaneously with operation of a number key, then the following occurs. That is, since the time required between the start of operation of a number key and the completion thereof, varies depending on the number of digits of a number to be called and the user's key operating pace, it is impossible to employ a structure in which the time required between the start of the operation of a number key and the completion thereof, is pre-calculated and the sound volume control unit performs control during the calculation.

The sound volume-controllable communication apparatus may further include a plurality of number keys operable by a user so as to designate a number, and a detector unit capable of detecting the operation of each number key. In this embodiment, every time the detector unit detects operation of any one of the number keys, the signal transmitting unit transmits a signal corresponding to a number assigned to the operated number key and at a time that can be determined on the basis of the operation of the number key. The sound volume control unit performs control by setting a volume lower than the volume normally set, in accordance with the time.

In this embodiment, the signal transmitting unit transmits a signal at a time that can be determined on the basis of the operation of the number key. The signal transmitting unit may be provided in various forms. For example, a device that starts transmitting a signal simultaneously with the start of the operation of a number key, and ends the transmission of the signal simultaneously with the completion of the operation of the number key; a device that starts transmitting a signal simultaneously with the initial operation of a number key, and ends the transmission at the elapse of a predetermined length of time following the start of transmission of the signal; a device that starts transmitting a signal at the elapse of a predetermined length of time following the initial operation of a number key, and ends the transmission at the elapse of a predetermined length of time following the initial start of transmission of the signal; and the like. Since each of these devices transmits a signal at a time that can be determined on the basis of the operation of a number key, any of these devices may be employed as the signal transmitting unit.

In this sound volume-controllable communication apparatus, the transmission of a signal by the signal transmitting unit and the volume reducing control by the sound volume control unit are simultaneously performed every time a number key is operated. Therefore, even if the time required between the initial operation of a number key and the completion thereof, varies depending on the user's operating pace or the number of the digits of a number to be designated, the control by the sound volume control unit can be performed without failure. Consequently, the monitoring sound at the time of transmission of a signal is not ear-offensive. At the same time, the communication apparatus also eliminates the problem that monitoring sounds are too low to hear at the time of reception of signals.

If the signal transmitting unit transmits a signal corresponding to a number pre-stored in a memory, the control by the sound volume control unit can easily be performed at an appropriate time and for an appropriate period since the number of digits of the stored number is known and the signals corresponding to the number can be transmitted at a predetermined interval or rate.

Therefore, the sound volume-controllable communication apparatus may further include a storage unit that stores a number. In this embodiment, the signal transmitting unit transmits, at a predetermined time, a signal corresponding to the number stored in the storage unit, and the sound volume control unit performs control so as to set a volume lower than the volume normally set, in accordance with the predetermined time.

This embodiment prevents ear-offensive sounds at the time of transmission of a signal, and eliminates the problem that monitoring sounds are too low to hear at the time of signal reception.

The signal transmitting unit may be provided in various forms. For example, a device that temporarily stores into a memory a number designated by a user, displays the number on a display device to allow the user to check the number, and starts actual transmission of signals when the user operates a transmission start key; a device that temporarily stores into a memory a number designated by the user, and after the number is called by transmitting signals, re-transmits the same signals when a redial key is operated; a device that stores into a memory a number registered by a predetermined operation, and then transmits signals corresponding to the registered number when a predetermined one-touch key operation is performed; and the like. Since each of these devices transmits signals corresponding to a number pre-stored in the memory, any of these devices may be employed as the signal transmitting unit.

BRIEF DESCRIPTION OF THE DRAWINGS

A preferred embodiment of the present invention will be described in detail with reference to the following figures wherein.

DETAILED DESCRIPTION OF PREFERRED EMBODIMENTS

A preferred embodiment of the present invention will be described in detail hereinafter with reference to the accompanying drawings.

A communication apparatus according to this embodiment is a facsimile apparatus capable of transmitting an image through a telephone line in a facsimile communication mode and also capable of functioning as a telephone to transmit voices.

Figure 1:
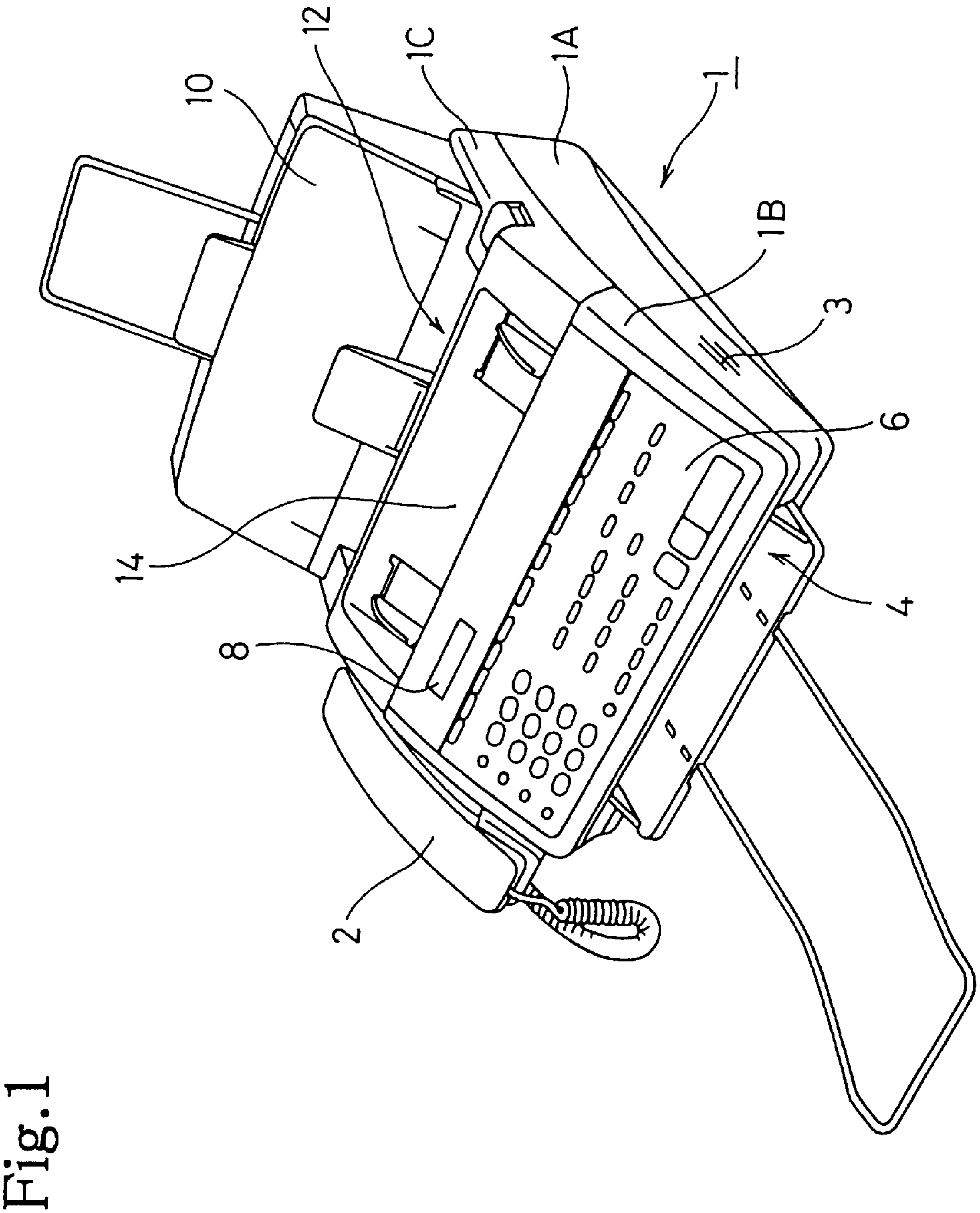
FIG. 1 is a perspective view of an external appearance of a facsimile apparatus according to a preferred embodiment of the invention.

Referring to FIG. 1, a facsimile apparatus 1 has an exterior substantially formed by a lower case 1A, an operating panel 1B fixed to an upper surface of a forward portion of the lower case 1A, and an upper cover 1C mounted on an upper surface of a rearward portion of the lower case 1A.

Mounted on the left side of the lower case 1A is a handset 2 that may be used when the facsimile apparatus 1 is used as a telephone or may be used to hear a signal tone from an exchange. Disposed on the right side of the lower case 1A is a speaker 3 for outputting voices and sounds (hereinafter, collectively referred to as "voices") that are being transmitted and received, as monitoring voices. Formed in a front portion of the lower case 1A is a document outlet 4 through which a document that has been scanned to obtain an image to be transmitted or copied, is discharged. The operating panel 1B carries in its upper surface a key input device 6 having many operating keys, and a liquid crystal display (LCD) 8 capable of displaying characters and the like in a dot matrix mode. A paper sheet case 10 for housing recording sheets to be fed for recording, protrudes from a rear portion of an upper surface of the upper cover 1C.

Formed on a front side of the sheet case 10 is a recorded sheet outlet 12 through which a sheet carrying the recording of an image received from an external apparatus or a copy image scanned, is discharged. Formed on an upper surface of a forward portion of the upper cover 1C is a document tray 14 for placing a document that is to be scanned to obtain an image to be transmitted or copied.

Figure 2:
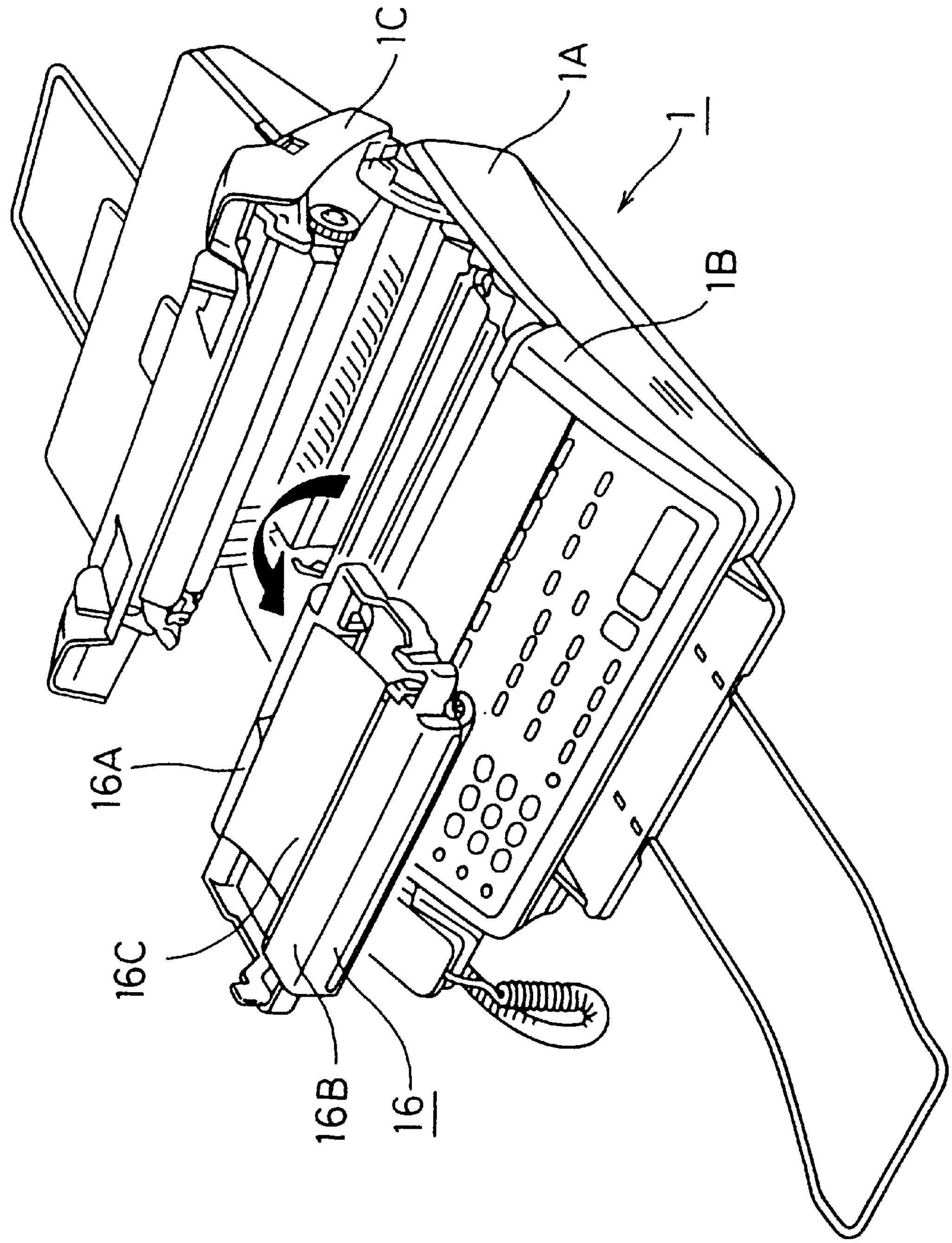
FIG. 2 is a perspective view of the facsimile apparatus shown in FIG. 1, wherein an upper cover is opened and an ink ribbon cartridge is detached.

The upper cover 1C is connected to the lower case 1A so as to be pivotable about a rear end portion of the lower case 1A, as shown in FIG. 2. Therefore, the upper cover 1C can be turned upward to an open position when an ink ribbon cartridge 16 is to be replaced, or when the maintenance of an interior portion of the facsimile apparatus 1 is to be performed, or the like. The ink ribbon cartridge 16 has a pair of rolls that are respectively contained in an ink ribbon feeder portion 16A and an ink ribbon recovering portion 16B. An ink ribbon 16C having approximately the same width as the recording sheets, is supported by the two rolls, extending therebetween with an appropriate tension. The ink ribbon cartridge 16 is designed so that new portions of the ink ribbon 16C are fed from the ink ribbon feeder portion 16A and the used portions of the ink ribbon 16C are wound up by the ink ribbon recovering portion 16B as recording progresses. An upper side surface of the ink ribbon 16C is coated with a hot-melt ink. During recording, a recording sheet is placed face-to-face on the ink-coated surface of the ink ribbon 16C, and they are together conveyed through a gap between a platen roller and a line-type recording head having approximately the same width as the recording sheet. The thermal transfer recording of an image is thus performed.

A control system of the facsimile apparatus 1 will next be described in reference to FIG. 3. The control system of the facsimile apparatus 1 includes a known CPU 21 for controlling the operations of various units and portions of the facsimile apparatus 1, a ROM 22, an EEPROM 23, a RAM 24, a printer unit 26, a scanner unit 27, a network control unit (NCU) 28, a modem 29, an amplifier 32, a document sensor 34, a recording sheet sensor 35, an ink ribbon sensor 36, an upper cover sensor 37 and the like. The CPU 21 also controls the key input device 6 and the LCD 8.

The ROM 22 stores various control programs executed by the CPU 21, as well as various data and the like. The EEPROM 23 is a non-volatile memory capable of maintaining the data stored therein even when power is not supplied. The EEPROM 23 stores various setting data that are set and changed as desired by a user, and the like. The RAM 24 is a memory for temporarily storing various data while an operation is being executed. The RAM 24 has various storage areas, for example, a transmission image area for storing the image data of an image to be transmitted before it is actually transmitted, a received image area for storing the image data of an image received before it is printed, an outgoing message area for storing an outgoing message (hereinafter, referred to as "OGM") that is transmitted to a caller or an external apparatus during an automatic answering mode, an incoming message area for storing an incoming message (hereinafter, referred to as "ICM") received from a caller or an external apparatus during the automatic answering mode, and the like.

The printer unit 26 is a mechanism for performing thermal transfer recording on a recording sheet. More specifically, the printer unit 26 includes a conveying motor for conveying a recording sheet, a driver circuit connected between the conveying motor and the CPU 21, a line-type recording head for performing thermal transfer recording on a recording sheet, a driver circuit connected between the recording head and CPU 21, and the like. The scanner unit 27 is a mechanism for optically reading an image from a document, that is, a document fed to be scanned, and converting the image into electric signals. More specifically, the scanner unit 27 includes a conveying motor for conveying a document, a line-type image sensor for reading an image from a document, a driver circuit connected between the image sensor and the CPU 21, and the like.

The NCU 28 is a device for transmitting signals to and receiving signals from another facsimile apparatus through a telephone line. The modem 29 is a device for modulating and demodulating signals that are to be transmitted and have been received. The amplifier 32 is a circuit for amplifying the tone signals that are to be transmitted and have been received in order to output voices to the speaker 3.

The document sensor 34 detects the presence/absence of a document set on the document tray 14. The recording sheet sensor 35 detects the presence/absence of a recording sheet set in the paper sheet case 10. The ink ribbon sensor 36 detects the presence/absence of the ink ribbon 16C. The upper cover sensor 37 detects whether the upper cover 1C is open or closed. These sensors detect whether an object of detection is present at a predetermined position. Each sensor may be formed by, for example, a contact sensor that switches on or off in accordance with the contact or non-contact with a detection object, an optical sensor having a light emitting element and a light receiving element that are arranged so that a detection object will be located therebetween, an optical sensor having a light emitting element that emits light in the direction of a detection object and a light receiving element that receives light reflected from the object, and the like.

The facsimile apparatus 1 is connected to a telephone line 41 by the NCU 28. The telephone line 41 is connected to an exchange 42. An external communication apparatus 44 (e.g., a facsimile apparatus, a telephone, or the like) is connected to the exchange 42 by a telephone line 43. Alternatively, the facsimile device 1 may be wireless and communicate with other devices via a wireless communication network (not shown).

If one of the facsimile apparatus 1 and the external communication apparatus 44 outputs a request for connection to the other apparatus, the exchange 42 calls up the other apparatus. If the other apparatus answers the call, the exchange 42 connects the facsimile apparatus 1 and the external communication apparatus 44, thereby enabling the two apparatuses to communicate with each other.

Figure 4:
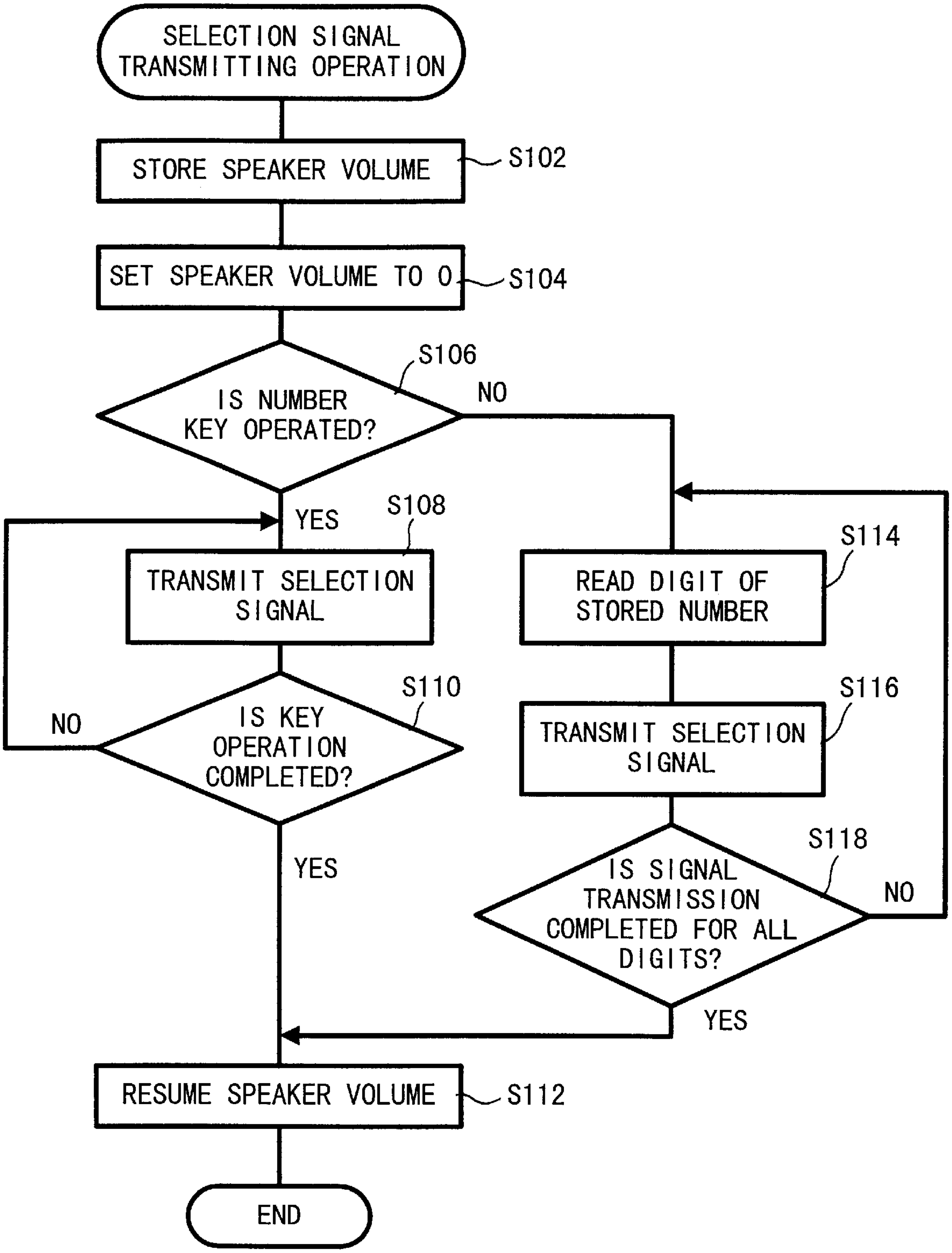
FIG. 4 is a flowchart of a selection signal transmitting operation.

A selection signal transmitting operation by the facsimile apparatus 1 will be described with reference to the flowchart of FIG. 4. In the facsimile apparatus 1, the CPU 21 constantly monitors the state of the various operating keys of the key input device 6. When any of the number keys or any of the automatic dial keys of the key input device 6 is operated, the CPU 21 starts the selection signal transmitting operation illustrated in FIG. 4. The aforementioned number keys are twelve operating keys assigned with the numbers of "0" to "9" and the symbols of "#" and "*". The automatic dial keys are keys for automatically calling a telephone number with plurality of digits pre-stored in a memory, with a one-touch key operation or a two or three-step operation. In this embodiment, the automatic dial keys include abbreviated dial keys for calling a pre-registered number (normally, a number frequently called) with a one-touch key operation, and a redial key that is operated to designate the number previously dialed and stored in a memory (normally, the number previously dialed using number keys), and the like.

When the selection signal transmitting operation is started, the CPU 21 first stores the present sound volume for the speaker 3 into the RAM 24 in step S102, and then sets the speaker volume to zero in step S104, thereby establishing a state where no sound will be produced from the speaker 3 regardless of the setting that a user made beforehand.

Subsequently in step S106, the CPU 21 checks whether any number key is operated. If any number key is operated (YES in step S106), a selection signal corresponding to the operated number key is transmitted to the exchange 42 in step S108. The transmission of the selection signal is continued until it is determined in step S110 that detection of the key operation is discontinued (YES in step S110). During this operation, no sound is produced from the speaker 3 since the sound volume is set to zero in step S104. Therefore, even if monitoring sound signals may be output during the transmission and reception of signals, the transmission of each selection signal is not accompanied by production of an ear-offensive monitoring sound.

When detection of the key operation is discontinued (YES in step S110), the operation proceeds to step S112, where the CPU 21 sets the speaker volume back to the value stored in the RAM 24 in step S102. Thereby, a state is established where sounds will be produced from the speaker 3 at the volume set by the user beforehand.

If an automatic dial key is operated instead of a number key, the CPU 21 makes a negative determination in step S106, and goes to a step S114, where the CPU 21 reads a number corresponding to the operated automatic dial key, one digit at a time, from a number storage provided in the EEPROM 23 corresponding to each of the different automatic dial keys (i.e., the redial key and the abbreviated dial keys).

Subsequently in step S116, the CPU 21 transmits to the exchange 42 a selection signal corresponding to the digit of the number read in step S114. In step S118, the CPU 21 determines whether all of the selection signals corresponding to the digits of the number have been transmitted. If not, the CPU 21 returns to step S114. Thus, the operation in steps S114–S118 is repeated until the transmission of all of the selection signals corresponding to the digits of the number is completed (YES in step S118).

When the transmission of all the selection signals corresponding to the digits of the number is completed (YES in step S118), the CPU 21 proceeds to step S112, where the speaker volume is set back to the value stored in the RAM 24 in step S102. Thereby, the state is established where sounds will be produced from the speaker 3 at the volume preset by the user.

In a case where number keys of the facsimile apparatus 1 are operated, the silencing of a monitoring sound and the transmission of a selection signal are substantially performed simultaneously every time a number key corresponding to a digit of the number to be called is operated. If a number of a plurality of digits is to be input, the selection signal transmitting operation is performed for each digit. Therefore, even if the time required between the start of the operation of a number key corresponding to a digit of a telephone number to be called and the completion thereof, varies depending on the user's operating pace, or even if the time required between the start of the operation of all the number keys corresponding to the digits of a number to be called and the completion thereof, varies depending on the number of the digits of the number called, production of a monitoring sound is prevented without failure during the transmission of each selection signal. Consequently, the ear-offensive monitoring sound of a selection signal is not produced. At the same time, the operation in the embodiment eliminates the problem of an inaudible volume of the tones of various signals, such as a ring-back tone, that are received after the dialing.

If an automatic dial key is operated, the silencing of a monitoring sound is continued until all of the selection signals corresponding to the digits of a number to be called have been completely transmitted. In this case, production of a monitoring sound is also prevented without failure during the transmission of selection signals, thereby preventing the ear-offensive monitoring sound of a selection signal. This operation also eliminates the problem of an inaudible volume of the tones of various signals, such as a ring-back tone, that are received after the dialing.

While the embodiment of the invention has been described, the invention may be carried out in various other forms. For example, although the facsimile apparatus 1 of the embodiment sets the monitoring sound volume to zero at the time of transmitting a selection signal, the invention is not limited to such an embodiment. For example, an embodiment may be employed in which the monitoring sound volume is reduced to such a low level that the monitoring sounds will not offend the ear. This embodiment makes it possible for a user to confirm the transmission of selection signals by listening to the monitoring sounds.

Alternatively, the normal monitoring sound volume may be low or zero. Thus, the invention may be carried out so that that monitoring sound volume remains at a normal or low volume at the time of transmitting a selection signal, but is raised after the transmission to a pre-set audible level.

Furthermore, although the facsimile apparatus 1 performs the monitoring sound silencing operation at the time of transmission of a selection signal in connection with both the number keys and the automatic dial keys, the invention may be applied to only one of the operation of the number keys and the operation of the automatic dial keys.

Further, although the facsimile apparatus 1 is designed to substantially start transmitting a selection signal simultaneously with the start of the operation of a number key and to substantially end the transmission of the selection signal simultaneously with the completion of the operation of the number key, the period of transmission of a selection signal may be fixed at a predetermined length of time, so that the transmission of a selection signal can be performed on the basis of only the start of the operation of a number key. In such an embodiment, since the period between the start of transmission of a selection signal and the completion thereof, can easily be determined or found, the monitoring sound of the selection signal can be prevented without failure.

It is also possible to employ an embodiment in which when number keys are operated, the numbers corresponding to the keys are sequentially stored into a memory, so that the transmission of the corresponding selection signals is performed non-synchronously with the operation of the number keys by sequentially reading the numbers from the memory. This embodiment makes it possible to perform an operation similar to the operation described above in conjunction with the operation of an automatic dial key, in order to prevent production of a monitoring sound. Various methods for transmitting selection signals non-synchronously with the operation of number keys, may be employed, such as a method in which the transmission is started when a transmission start key is operated after the operation of number keys, a method in which the transmission is automatically started at the elapse of a predetermined delay time following the operation of number keys, and the like.

In an embodiment in which the transmission is started when the transmission start key is operated, the number designated using number keys may be displayed on a display device, so that a user can advantageously double-check the number before operating the transmission start key. With regard to an embodiment in which the transmission is automatically performed at the elapse of a predetermined delay time, if the time between the start of the operation of number keys and the completion thereof, or the time between the completion of the operation of a number key and the start of the operation of the next number key is unusually long or short, the numbers input can be stored in the memory, and the time between the start of transmission of the corresponding selection signals and the completion thereof, along with the transmission interval, can be adjusted to appropriate lengths of time.

Whereas the number keys of the facsimile apparatus 1 can be operated not only for establishing a connection to an external communication apparatus, but also for other purposes, such as for transmitting number data, or the like. The automatic dial keys of the facsimile apparatus 1 are normally operated only for establishing a connection to an external communication apparatus. Therefore, it is also possible to employ the following embodiment. That is, if an automatic dial key is operated, it is determined whether the connection to an external communication apparatus has been established or has not been established (including a case where a connection request is being output). If the connection has not been yet established, the operation of the automatic dial key is accepted. If the connection has already been established, the operation of the automatic dial key is not accepted.

Although the invention has been described in conjunction with the facsimile apparatus 1 according to the embodiment, it should be apparent that the application of the invention is not limited to facsimile apparatuses with a monitoring sound outputting function. The invention may be applied to various other communication apparatuses, for example telephones, personal computers with communication functions, and the like, as long as the communication apparatuses have a function of outputting monitoring sounds and voices from a speaker.

Figure 3:
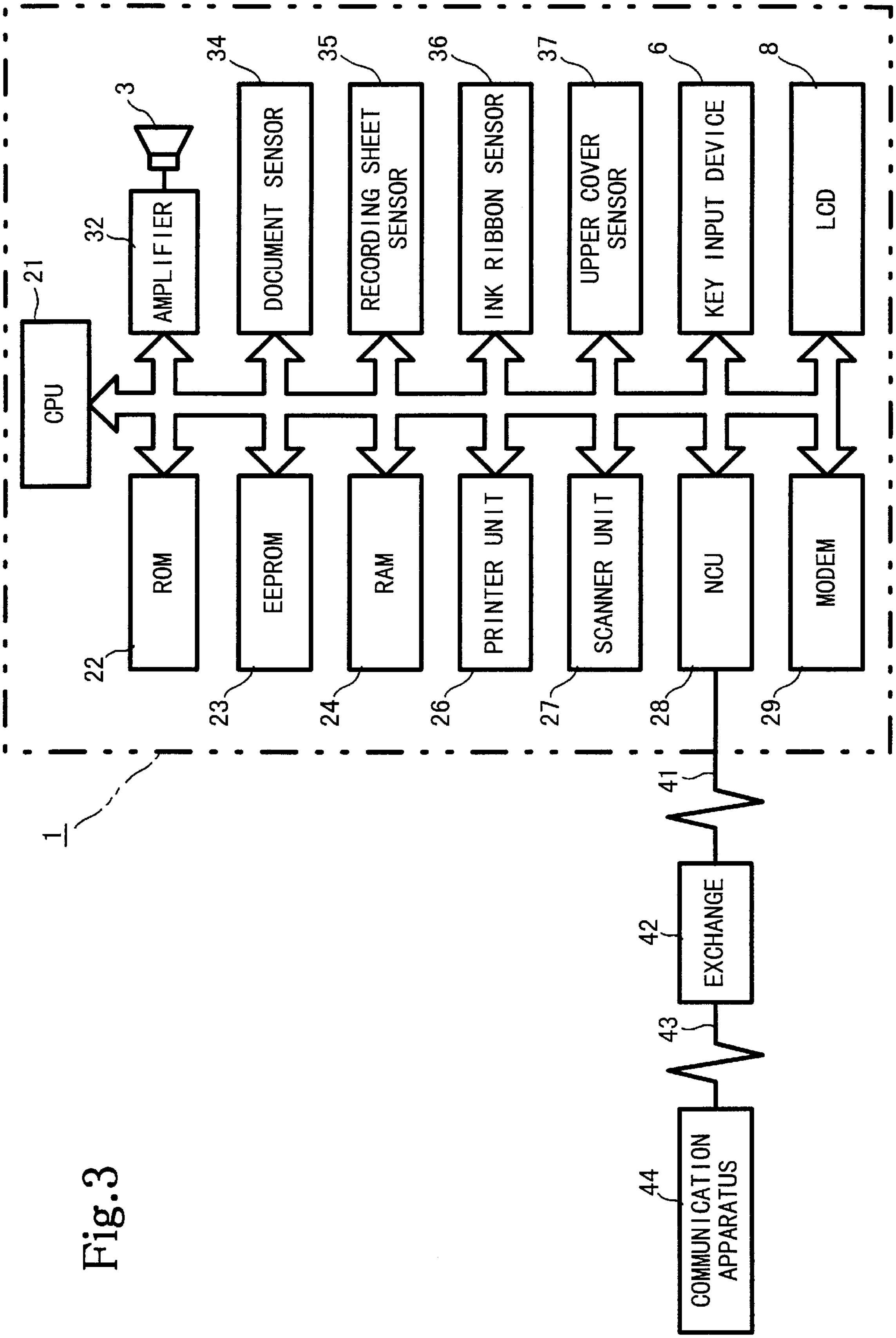
FIG. 3 is a block diagram of a control system of the facsimile apparatus.

As shown in FIG. 3, control of the sound volume output in the facsimile apparatus 1 is preferably implemented using the ROM 22. However, the control of the voice signal output can also be implemented using the EEPROM 23, a PROM, an EPROM, or a CD-ROM and floppy-disk drive, or the like.

It is to be understood that the invention is not restricted to the particular forms shown in the foregoing embodiment. Various modifications and alternations can be made thereto without departing from the scope of the invention.

What is claimed is:

1. A sound volume-controllable communication apparatus, comprising:

a sound outputting unit that outputs sounds, including sounds corresponding to a selection signal, wherein the selection signal sounds are output simultaneously with transmission of the selection signal:

a signal transmitting unit that transmits the selection signal corresponding to a designated number; and a sound volume control unit that controls a volume of the output sounds, such that a volume of the selection sounds output from the sound outputting unit at time of transmission of the selection signal by the signal transmitting unit, is different than a volume of non-selection signal sounds, wherein the selection signal and the non-selection signal exclude voice signal.

2. The sound volume-controllable communication apparatus of claim 1, wherein the volume of the selection signal sounds output from the sound outputting unit at the time of transmission of the selection signal by the signal transmitting unit, is lower than the volume of non-selection signal sounds.

3. The sound volume-controllable communication apparatus of claim 2, wherein the volume of the non-selection signal sounds output from the sound outputting unit after the time of transmission of the selection signal by the signal transmitting unit, is higher than the volume of selection signal sounds.

4. The sound volume-controllable communication apparatus of claim 1, further comprising:

a plurality of number keys; and a detector unit that detects an operated state of each number key.

5. The sound volume-controllable communication apparatus of claim 4, wherein the signal transmitting unit transmits the selection signal corresponding to a number assigned to the operated number key every time the detector unit detects the operated state of any one of the plurality of number keys.

6. The sound volume-controllable communication apparatus of claim 5, wherein the signal transmitting unit transmits the selection signal corresponding to a number assigned to the operated number key at a time that can be determined on the basis of the operated state of the number key.

7. The sound volume-controllable communication apparatus of claim 6, wherein the sound volume control unit performs control so as to set a volume different than a pre-set volume, in accordance with the time.

8. The sound volume-controllable communication apparatus of claim 1, further comprising:

a storage unit that stores a number;

wherein the signal transmitting unit transmits, at a predetermined time, the selection signal corresponding to the number stored in the storage unit.

9. The sound volume-controllable communication apparatus of claim 1, wherein the signal transmitting unit transmits at a predetermined time.

10. The sound volume-controllable communication apparatus of claim 9, wherein the sound volume control unit performs control so as to set a volume different than the pre-set volume, in accordance with the predetermined time.

11. A sound volume-controllable communication apparatus, comprising:

sound outputting means for outputting sounds, including sounds corresponding to a selection signal, wherein the selection signal sounds are output simultaneously with transmission of the selection signal;

signal transmitting means for transmitting the selection signal corresponding to a designated number; and sound volume control means for controlling a volume of the output sounds, such that a volume of the selection signal sounds output from the sound outputting unit at time of transmission of the selection signal by the signal transmitting unit, is different than a volume of non-selection signals sounds, wherein the selection signal and the non-selection signal exclude voice signal.

12. The sound volume-controllable communication apparatus of claim 11, wherein the volume of the selection signal sounds output from the sound outputting unit at the time of transmission of the selection signal by the signal transmitting unit, is lower than the volume of non-selection signal sounds.

13. The sound volume-controllable communication apparatus of claim 12, wherein the volume of the non-selection signal sounds output from the sound outputting unit at the time of transmission of the selection signal by the signal transmitting unit, is higher than the volume of selection signal sounds.

14. The sound volume-controllable communication apparatus of claim 11, further comprising:

a plurality of number keys; and detecting means for detecting an operated state of each number key.

15. The sound volume-controllable communication apparatus of claim 14, wherein the signal transmitting means transmits the selection signal corresponding to a number assigned to the operated number key every time the detecting means detects the operated state of any one of the plurality of number keys.

16. The sound volume-controllable communication apparatus of claim 15, wherein the signal transmitting means transmits the selection signal corresponding to a number assigned to the operated number key at a time that can be determined on the basis of the operated state of the number key.

17. The sound volume-controllable communication apparatus of claim 16, wherein the sound volume control means performs control so as to set a volume different than a pre-set volume, in accordance with the time.

18. The sound volume-controllable communication apparatus of claim 11, wherein the signal transmitting means transmits at a predetermined time, and the sound volume control means performs control so as to set a volume different than the pre-set volume, in accordance with the predetermined time.

19. A storage medium for a sound volume-controllable communication apparatus, comprising:

a program for outputting sounds, including sounds corresponding to a selection signal, wherein the selection signal sounds are output simultaneously with transmission of the selection signal;

a program for transmitting the selection signal corresponding to a designated number; and a program for controlling a volume of the output sounds, such that a volume of the selection signal sounds output from the sound outputting unit at time of transmission of the selection signal, is different than a volume of non-selection signal sounds, wherein the selection signal and the non-selection signal exclude voice signal.

20. A method for controlling sound volume in a sound volume-controllable communication apparatus, comprising:

outputting sounds, including sounds corresponding to a selection signal, wherein the selection signal sounds are output simultaneously with transmission of the selection signal:

transmitting the selection signal corresponding to a designated number; and controlling a volume of the output sounds, such that a volume of the selection signal sounds output at time of transmission of the selection signal, is different than a volume of non-selection signal sounds, wherein the selection signal and the non-selection signal exclude voice signal.

* * * * *